United States Patent [19]

Aechter et al.

[11] 4,176,337
[45] Nov. 27, 1979

[54] APPARATUS FOR MEASURING THE TIME BETWEEN RECEIVED PULSES

[75] Inventors: Burckhard Aechter, Achim; Manfred Gerlach, Bremen, both of Fed. Rep. of Germany

[73] Assignee: Fried. Krupp Gesellschaft mit beschrankter Haftung, Essen, Fed. Rep. of Germany

[21] Appl. No.: 915,228

[22] Filed: Jun. 13, 1978

[30] Foreign Application Priority Data

Jun. 15, 1977 [DE] Fed. Rep. of Germany ....... 2726981

[51] Int. Cl.² .............................. G01S 9/68; G01P 5/18
[52] U.S. Cl. ..................................... 367/131; 367/135; 73/194 A; 343/7A
[58] Field of Search ............... 340/1 R, 3 C, 3 R, 5 S; 73/194 A; 343/7 A

[56] References Cited

U.S. PATENT DOCUMENTS

| | | | |
|---|---|---|---|
| 3,454,922 | 7/1969 | Dory | 340/1 R |
| 3,887,871 | 6/1975 | Aechter et al. | 324/181 |
| 4,094,193 | 6/1978 | Gerlach | 73/194 A |

FOREIGN PATENT DOCUMENTS

1076980 8/1960 Fed. Rep. of Germany .

776526 6/1957 United Kingdom ................. 73/194 A

OTHER PUBLICATIONS

Meinke et al., *Taschenbuch der Hochfrequenztechnik*, 1968, pp. 627–675, 1526–1528.

*Primary Examiner*—Richard A. Farley
*Attorney, Agent, or Firm*—Spencer & Kaye

[57] ABSTRACT

Apparatus for use with a system in which successive pulses, each composed of a train of high frequency oscillations, are emitted by a transmitting transducer, propagated through a transmission medium, and received by a receiving transducer having a given transient behavior, the apparatus serving to measure the time interval between reception of successive pulses by the receiver transducer and to prevent erroneous measurements resulting from propagation of the pulses over indirect paths through the transmission medium, prevention of erroneous measurements being achieved by effecting time interval measurements only with respect to those pulses for which the output signal from the receiving transducer in response to reception of each such pulse exceeds a selected threshold value during a predetermined time interval subsequent to passage of that output signal above a given comparison value which is less than the threshold value.

9 Claims, 18 Drawing Figures

APPARATUS FOR MEASURING THE TIME BETWEEN RECEIVED PULSES

BACKGROUND OF THE INVENTION

The present invention relates to an apparatus for measuring the time between pulses transmitted by a sending transducer and received by receiving transducers with known transient behavior and for eliminating measuring results which are erroneous due to travel of the pulses in the transmission medium over propagation paths of different lengths.

In the reflected beam ranging art, pulse-shaped electromagnetic ot acoustic waves are transmitted and received again after being reflected. If the propagation speed in the transmission medium is known, the time between emission of the transmitted pulse and receipt of the received pulse is a measure of the length of the travel path. Conversely, if the distance is known, this time indicates the propagation speed.

Such time measurement is also effected to determine the flow speed of a flowing medium in that sound energy is transmitted in a "sing-around" method over a known measuring path oriented obliquely to the direction of flow and the repetition frequency of the transmitted or received pulses, or the time between successive pulses, is evaluated.

In order to be able to effect such time measurement, it is known, for example, to use a circuit arrangement, such as that of the acoustic flowmeter disclosed in British Pat. No. 776,526, in which each received pulse is checked in a threshold value detector to control triggering of the next transmitted pulse. If the oscillations of the received pulse exceed a given threshold, the next transmitted pulse is actuated and its repetition frequency is evaluated to measure the flow speed.

With the above measuring technique, the accuracy with which the time between pulses is measured is directly dependent on the precision with which the start of oscillations of a pulse can be determined. This time of receipt itself is not accessible to measurement because the envelope of the received pulse does not have an infinitely steep leading edge. Rather it is flattened by the transient behavior of the receiving transducer, and possibly of a subsequent amplifier circuit.

In the described circuit arrangement, the use of a threshold value results in performance of a time measurement at a point on the envelope leading edge which has a known position with respect to the time of receipt. However, the threshold value detector furnishes the wrong measuring results when the envelope of the received pulse has been deformed by interference.

Interference is produced, for example, by reflections of the wave energy at the boundaries of the transmission path since the beam angle of the emitted wave energy cannot be made as small as may be desired. Thus waves of different phase are superposed at the receiving end after traveling thereto on different propagation paths. In the most unfavorable case, the superposition leads to complete extinction, for example if the waves are received in phase opposition.

If the envelope is deformed in the region of its leading edge, the passage of the threshold is not an accurate measure for the start of the received pulse, so that reliable time measurement between two pulses cannot be made with a threshold value detector alone.

SUMMARY OF THE INVENTION

It is therefore an object of the present invention to measure the time between pulses in a manner which makes possible recognition and elimination of measuring results which have been falsified by variations in the propagation paths of the wave energy.

This and other objects are accomplished, according to the present invention, by setting the threshold in the threshold value detector in dependence on the peak value of the oscillations after a transient phase so as to emit an output signal when the threshold has been exceeded by the oscillations of the received pulse, by delivering the oscillations of the received pulse to a rise filter which includes a comparator receiving a comparison voltage that is substantially lower than the peak value of the oscillations after the transient phase and a timer triggerable by the comparator for a rising pulse whose duration is equal to or greater than the reciprocal of the band width of the receiving transducer and at most equal to its starting phase, by connecting the rise filter and the threshold value detector to a signal generator which emits a "good" signal at its output if the output signal appears during the rise pulse and which is connected with a measuring arrangement to indicate the time instant.

The apparatus according to the invention senses whether the oscillations of the received pulse in the region of its wave front exceed the threshold of the threshold value detector during the transient period. This threshold preferably has a value of $1/\sqrt{2}$ times the peak value of the oscillations after the transient period.

The comparison voltage in the rise filter is substantially lower and lies slightly above a possibly given fundamental noise level. When the comparison voltage is exceeded, the timer is triggered and the rise filter emits its rise pulse so that an observation space, or period, is produced in which the oscillations reach their maximum value if the propagation of the wave energy is not interfered with. In that case the threshold value detector emits an output signal during this period so that the connected signal generator produces a "good" signal.

The rise filter controls whether the rate of rise of the peak values of the oscillations corresponds to the slope of the uninterfered-with wave front of the envelope of the peak values. The peak values must exceed the threshold within at least a time period which is equal to the reciprocal of the band width of the receiving transducer, and, at most, a time period which is equal to the transient period, and must then reach their maximum value.

With interference-free reception, a "good" signal appears at the output of the signal generator so as to permit measurement of the time expired between the transmitted and the received pulses or between two successive received pulses. For this time measurement, a time indicating measuring arrangement is connected with the signal generator.

According to an advantageous embodiment of the invention, the envelope of the received pulse is formed in an envelope detector in the threshold value detector and is differentiated with respect to time in a differentiating stage. A positive maximum function results, in the form of the time derivative, if the received pulse did not experience any interference in the region of the wave front. If the envelope exhibits breaks during the transient period, resulting from phase-opposition superposition of the waves, the first time derivative will be a function having at least two zero passages since the slope changes its sign as a result of the breaks. When the waves propagate along several paths, the received pulse may also be flattened and broadened. The wave front then has a positive slope which rises at a substantially slower rate than in the interference-free state.

The time curve, or waveform, of the derivative is compared in a comparison stage with a comparison value serving as a threshold which is set so that the first time derivative of the envelope in the interference-free state passes the comparison value while varying successively, in time, in the mathematically positive and negative directions. The connected control circuit senses how many positive or negative passages are included in the first derivative waveform. It emits a control signal, constituting the output signal of the threshold value detector, only if the derivative has gone above or below the comparison value set in the comparison stage only a single time. This assures that the described interference is recognized in the region of the wave front of the received pulse and the received pulse will be evaluated only if it has been received without interference.

A particular advantage of this evaluation is that an output signal is generated in the threshold value detector, independently of the height of the peak values of the oscillations, only if the envelope is a unidirectional rising function whose slope exceeds and falls below the minimum value once during the transient period.

Instead of using the time derivative of the envelope to detect erroneous measuring results, there is provided, in an advantageous embodiment of the invention, in addition to the rise filter and the threshold value detector including the threshold value generator and the comparison circuit, a pulse edge detector with connected monostable multivibrator for the received pulses. The pulse edge detector determines a reference value on the envelope from the relationship of two peak values of the transient oscillation. The reference time between onset of the oscillations and reaching the reference value is known from the transient behavior of the pulse. Such a pulse edge detector is disclosed in German Offenlengungsshrift [Laid-open Application] No. 22 54 019 and counterpart U.S. Pat. No. 3,887,871. The advantage of this pulse edge detector is, in particular, that the reference period makes the time of receipt very easy to determine.

In the pulse edge detector the oscillation is fed, on the one hand, to a delay line and, on the other hand, to an attenuating unit producing an attenuation equal to or greater than the ratio between two successive peak values of the transient oscillation occurring within a known time interval. The delay is equal to the time interval between the two peak values. By comparing the attenuated and the delayed oscillations, the reference value is obtained upon coincidence and its position on the envelope indicates the reference time.

The pulse edge detector is connected with a monostable multivibrator which is triggered by the reference value. The period during which the monostable multivibrator remains in its astable switching state, which is selected to be equal to the reciprocal of the band width of the receiving transducer, creates a time window into which the output signal of the threshold value detector must fall if the wave front of the received pulse is not deformed. The wave front reception is known from the reference time plus the astable state period of the monostable multivibrator and is delimited by the return to its stable state by the monostable multivibrator which is connected to the signal generator. If the output signal of the threshold value detector appears later, this indicates that the envelope of the received pulse is affected by interference and the signal generator is blocked by the monostable multivibrator flipping back to its stable state or by the rise filter, respectively. The time duration of the wave front is here selected to be equal to the transient period of the receiving transducer.

The signal generator is enabled by the monostable multivibrator during an observation period for actuation by the threshold value detector and is blocked by the rise filter. According to the present invention, the signal generator includes two series-connected bistable, or flip-flop, stages to which a pulse generator is connected. Each bistable stage is provided with a signal input, a trigger input and a clock pulse input.

The signal input of the first bistable stage is connected to the output of the monostable multivibrator. During the astable state period of the monostable multivibrator, the first bistable stage can be switched to logic "1" if an output signal appears at its pulse input which is connected to the output of the threshold value detector. The clock pulse input of the series-connected bistable stage is connected to the output of the monostable multivibrator.

If the monostable multivibrator jumps back to its stable state at the end of the observation period, a logic "1" output signal is generated at the output of the second bistable stage if the output of the first bistable stage also presents a logic "1". The appearance of a "1" at the output of the second bistable stage triggers the pulse generator to emit the "good" signal. The two bistable stages are reset to logic "0" by the output signal from the rise filter when the transient period is over.

The time at which the "good" signal appears is defined by the time interval between the onset of the oscillations and attainment of the reference value plus the astable period of the monostable multivibrator during the observation period so that a conclusion can be made from the appearance of the "good" signal as to the time of receipt of the received pulse.

With continuous measurements of successive received pulses over a longer period of time, the apparatus according to the invention can indicate, or eliminate, faulty measurements as a result of deformation of one or a plurality of received pulses.

According to a further advantageous feature of the invention, provision is made for the possibility that all received pulses are incapable of being evaluated by arranging a plurality of receiving transducers one below the other, perpendicularly to the direction of propagation of the wave energy, so that switching to an adjacent receiving transducer can be effected to continue the measurement. The receiving transducers are connected to the contacts of a controllable switch at whose output the received pulses are present. The switch is actuated by an error detector which evaluates the "good" signal from the signal generator.

If during a given observation period no "good" signals appear at the output of the signal generator, the switch is actuated by the error detector and switched to the next receiving transducer.

This feature of the invention is based on knowledge of the transmission of information in the radio art where diversity reception is provided for fading phenomena occurring as a result of multi-path propagation, in which a plurality of spaced receiving transducers are arranged at the receiving end to be selected in dependence on the selected frequency, the angle of emission and the reflection layer of the space wave. The principles of fading phenomena and diversity reception are described in the *Pocketbook of the High Frequency Art* by Meinke, Gundlach, third revised edition, Springer Verlag, 1968, in the chapters J, "Wave Propagation" and X, "Multiple Reception".

The switching criterion is produced, according to the present invention, in the error detector which, according to a further feature of the invention, includes a counter having its erase, or reset, input connected to the signal generator and having its counting input connected to receive clock pulses. If during a period determined by the counting clock pulses and the capacity of the counter, a "good" signal appears, the counter content is erased and counting is begun anew. If no "good" signal appears, a switching signal is generated at the carry output of the counter when it has reached its maximum count, and the switching signal acts to advance the controllable switch. The time period for the error detection is set in accordance with the anticipated time between two received pulses.

According to the present invention, the clock pulse for the error detector can be derived with particular advantage from a phase locked loop circuit serving as the measuring arrangement for the time between two received pulses. The phase locked loop circuit includes a frequency comparison circuit and a tunable oscillator with connected frequency divider. In the frequency comparison circuit, the repetition frequency of the received pulses is compared with the divided frequency of the oscillator and the oscillator is retuned if it deviates from the repetition frequency. The frequency at the output of the frequency divider, if there is alignment, is equal to the repetition frequency of the received pulses and the period duration of those pulses is displayed in a time display.

If the number of transmitted pulses within a measured period is known, there can be provided, according to a further feature of the invention, an error detector which includes a backward counter whose counting state is set at the beginning of each measuring period to such number of transmitted pulses. The counting input of the backward counter is connected to the signal generator. Whenever a "good" signal appears during the measuring period, the counter state is reduced by one. At the end of the measuring period, the backward counter is empty if all received pulses were evaluatable. If there were received pulses which had been interfered with during transmission, a switching signal appears at the output of the comparison circuit which is connected behind the backward counter.

The particular advantage of the apparatus according to the invention is that flattening of the wave front within the transient period of the receiving transducer or breaks in the envelope of the received pulses produced by multipath propagation of the wave energy no longer lead to faulty measuring results in the measurement of the time expired between two pulses. The apparatus according to the invention is distinguished by the fact that it can be realized with simple circuitry. When a plurality of receiving transducers are used according to the diversity principle, the apparatus according to the invention provides an elegant switching criterion if the received pulses from one receiving transducer are no longer evaluatable due to interference. It is of particular advantage for measuring the time between the received pulses and for generating a switching signal to use a phase locked loop circuit whose set frequency indicates the repetition frequency of the received pulses, even if no measuring result has been obtained for a given period of time.

DESCRIPTION OF THE PREFERRED EMBODIMENTS

The mode of operation of apparatus according to the present invention, as exemplified by the block circuit diagram of FIG. 1, will be explained for the example of a flow speed measuring device. To effect such measurement, as is known, sound energy is emitted by a transmitting transducer S arranged, as shown in FIG. 2, at the shore of a body of flowing water in a direction oblique and counter to the direction of flow and is received at a location E' on the other shore by a receiving transducer $W_1$. A particularly advantageous arrangement of measuring paths has already been described in German Patent Application No. P 26 28 336.3 and counterpart allowed U.S. application Ser. No. 794,660, filed by Manfred Gerlach on May 6th, 1977, now U.S. Pat. No. 4,094,193. The received pulses occur at a repetition rate which depends due to their directions of transmission with and counter to the stream, on the sum and difference of the pulse propagation speed and stream flow speed, the length of the measuring path being known, and provides an indication of the flow speed of the stream, as disclosed in German Pat. No. 1,076,980.

However, the measurement of the pulse repetition rate may be falsified at the receiving end E' by interference if the sound energy, which is emitted at a beam angle $\alpha$, does not propagate only along a direct path $s_1$ from the transmitting transducer S to the receiving end E' but also via indirect paths such as $s_2$ and $s_3$ which correspond to the beam boundaries. This multipath propagation has a particularly negative effect in the case of paths which impinge at the surface of water since the sound energy is there reflected virtually without attenuation losses.

FIG. 3a illustrates the waveforms of the receiving transducer response to three different received pulses occurring in the water body depicted in FIG. 2, the pulses being depicted along three mutually independent time scales. FIG. 3a illustrates the starting transient oscillations of each such received pulse. The first pulse depicted extends over a time region $E_1$ and is received under such conditions that the waveform of the receiving transducer output is determined essentially by the transient behavior of the receiving transducer, the envelope of the starting transient being a unidirectionally increasing function with positive slope. The second received pulse has a starting transient extending over a time region $E_2$ and the envelope thereof is interrupted by breaks due to interference. The third received pulse has a starting transient in time region $E_3$ whose envelope increases unidirectionally but with a slope lower than in region $E_1$ due to multipath propagation of the transmitted pulse waves.

Figure 1:
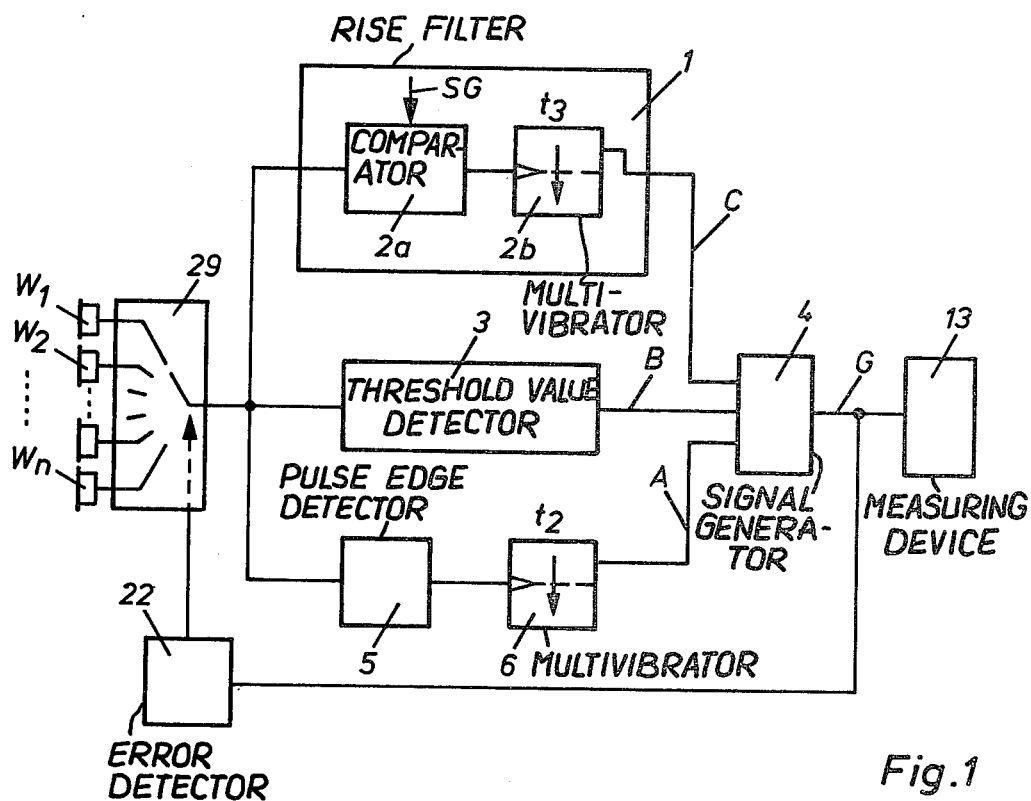
FIG. 1 is a block circuit diagram of the basic structure of a preferred embodiment of the apparatus according to the invention.
Figure 2:
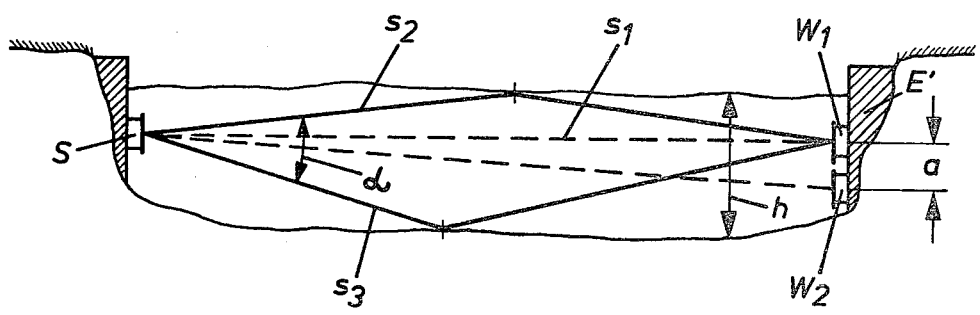
FIG. 2 is a simplified pictorial view of a body of water in which measurements are to be performed according to the invention.

Referring to the apparatus shown in FIG. 1, the received sonic pulses are connected in transducer $W_1$ to a corresponding electrical signal which is fed to a rise filter 1 composed of a comparator 2a and a series-connected time generator 2b. In comparator 2a the received pulse signal is compared with a comparison voltage SG, shown in FIG. 3a, which voltage can preferably be set in dependence on the fundamental interference level threshold. If the oscillations constituting the received pulse exceed the comparison voltage SG, comparator 2a triggers the time generator 2b with the result that a rise pulse C appears at the output of generator 2b. The duration of this rise pulse is set to be equal to, or greater than, the reciprocal of the band width of the receiving transducer W and at most equal to its transient response period $t_3$. FIG. 3b shows the rise pulse C at the output of the rise filter 1.

Additionally, the received pulse signal from transducer $W_1$ is delivered to a threshold value detector 3 in which the curve of the peak values of the oscillations in the starting transient is observed, the detector 3 emitting an output signal B, as shown in FIG. 3c, constituted by a pulse at each instant when the oscillations exceed a settable threshold. At the output of a signal generator 4 which is connected to the outputs of the rise filter 1 and the threshold value detector 3, a "good" signal G appears, as shown in FIG. 3i, if during the period of a rise pulse C the peak values of the received pulse produce a pulse in output signal B at the output of the threshold value detector 3.

Figure 3:
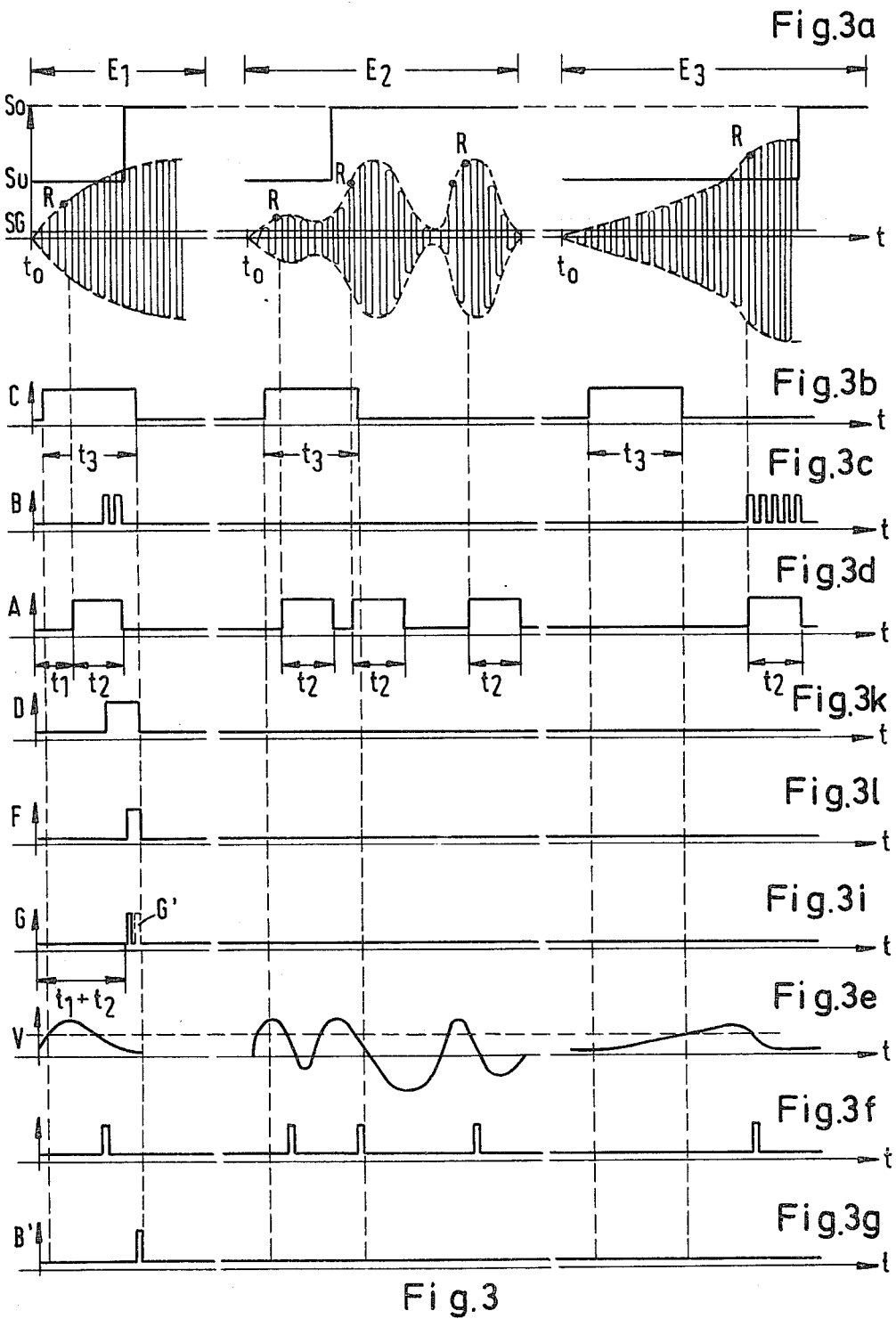
FIGS. 3a through 3g are diagrams illustrating signal waveforms at various points in a circuit according to the invention.

According to a further feature of the invention, a pulse edge detector 5 is provided to check the received pulse signals in addition to the rise filter 1 and the threshold value detector 3. In the pulse edge detector 5, one embodiment of which is disclosed in German Offenlegungsschrift [Laid-open Application] No. 22 54 019 and counterpart U.S. Pat. No. 3,887,871, issued to Burckhard Aechter and Manfred Gerlach on June 3rd, 1975, there is determined on the envelope of the received pulse signal a reference value R which appears in the case of interference-free reception at a reference time $t_1$ after the time $t_0$ of arrival of the leading edge of the received pulse signal. The occurrence of reference value R results in a reference signal that triggers a monostable multivibrator 6 which is connected to the output of pulse edge detector 5. The signal conducted to multivibrator 6 corresponds to signal s24 shown in FIG. 3 of U.S. Pat. No. 3,887,871. The monostable multivibrator 6 has a pulse period, i.e. an astable state period, $t_2$ which is at least as long as the reciprocal of the band width of the receiving transducer W and less than the time duration of each rise pulse in the signal C at the output of the rise filter 1. Preferably, the time duration of each such rise pulse is equal to the normal transient period $t_3$. FIG. 3d shows the output signal A of the monostable multivibrator 6 over time t.

Figure 4:
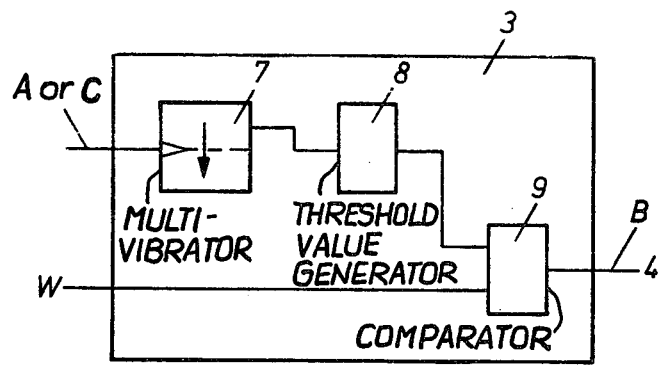
FIG. 4 is a block circuit diagram of an embodiment of a threshold value detector employed in the apparatus of FIG. 1.

FIG. 4 shows a block circuit diagram of a preferred embodiment of the threshold value detector 3 according to the invention including a monostable multivibrator 7 connected in series with a threshold value generator 8 and a comparison circuit 9. The threshold value generator 8 produces a lower threshold output signal $S_u$ which is approximately equal to $1/\sqrt{2}$ times the peak value of the pulse signal oscillations in the steady state of such signal until the multivibrator 7 has been triggered, at the end of the period $t_2$, by a negative edge of a pulse in the output signal A from the monostable multivibrator 6.

It is likewise possible for the negative edge of a rise pulse in the output signal C from rise filter 1 to switch the multivibrator 7.

Each time the peak value of an oscillation of the received pulse signal exceeds the lower threshold value $S_u$, the comparison circuit 9 emits a pulse in its output signal B as shown in FIG. 3c.

When in its astable state, i.e. when producing a pulse, multivibrator 7 causes threshold value generator 8 to switch in an upper threshold value $S_o$ which is significantly higher than the peak value of the oscillation when a received pulse is in its steady state. Due to the presence of the upper threshold value $S_o$, acoustic pulse signals which travel to receiver $W_1$ over indirect paths during a time after $t_0$ which is shorter than the time between two received pulses and longer than the time difference between the arrival of a received pulse over the direct propagation path $s_1$ and over its longest possible indirect path $s_2$ or $s_3$, respectively, are unable to falsify the time measurement between two received pulses. Thereafter the threshold value generator 8 is again switched to produce the lower threshold value $S_u$.

If the oscillations of a received pulse signal, after reaching the reference value R, do not exceed the lower threshold $S_u$ of threshold value generator 8 within the period $t_2$, no output pulse appears in the output B of threshold value detector 3.

In the case of time region $E_2$ of FIG. 3a, a received pulse is shown whose peak values do not pass the lower threshold value $S_u$ of threshold value detector 3 during a first period $t_2$. After first reaching the reference value R with which the monostable multivibrator 6 is triggered, the envelope has a break if the waves reach the receiving transducer W, on the one hand, over the direct propagation path $s_1$ and, on the other hand, over indirect paths $s_2$ and $s_3$, as shown in FIG. 2, so that no pulse appears in output signal B of the threshold value detector 3 during the first period $t_2$. At the end of the first period $t_2$, monostable multivibrator 7 switches the threshold value generator 8 to the upper threshold value $S_o$. A later arriving received pulse, reaching receiving transducer W over an indirect path $s_2$, as shown in FIG. 3a in region $E_2$, is therefore ineffective although the monostable multivibrator 6 has been restarted by a subsequent reference signal from pulse edge detector 5, as shown in FIG. 3d, since the upper threshold value $S_o$ which the peak values of the received pulses cannot exceed, has previously been set in the threshold value generator 8.

FIG. 3a shows, for the case depicted in time region $E_3$, a received pulse signal in which the reference value R appears not at the end of reference time $t_1$ but much later, as shown in FIG. 3d. The slope of the envelope of the received pulse is here too shallow since waves reaching the receiving transducer W over indirect paths $s_2$ and $s_3$ do not permit normal transient behavior of the receiving transducer W. An error measurement is prevented by the action of rise filter 1 which blocks the signal generator 4 before the output signal from the threshold value detector 3 appears.

Figure 5:
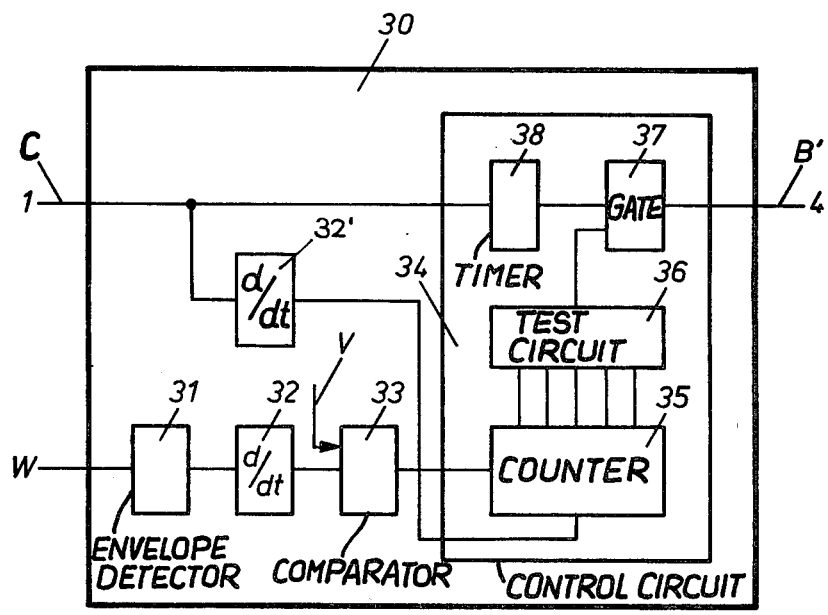
FIG. 5 is a block circuit diagram of a modified embodiment of a threshold value detector.

If the system is to operate without the pulse edge detector 5, it is of advantage, according to the present invention, to use a modified threshold value detector, such as detector 30 of FIG. 5, which evaluates the slope of the envelope of the received pulse signal to generate an output control signal B'. The modified threshold value detector 30 includes an envelope detector 31 connected in series with a differentiating stage 32 to form a signal representative of the first time derivative of the envelope of the received pulse signal after time $t_0$. The output of stage 32 is connected to one input of a comparison stage 33 whose output is connected to a control circuit 34. The comparison stage 33 also receives a comparison value V which serves as the threshold.

FIG. 3e shows the time derivative of the envelope at the output of the envelope detector 31 in solid lines and the comparison value V as a broken line. In the comparison stage 33 a determination is made as to when the first derivative of the signal envelope falls below the comparison value V, each occurrence of which results in the production of a pulse at the output of stage 33, as shown in FIG. 3f. FIG. 3f shows that it is only within time region $E_1$ that comparison stage 33 emits only a single pulse during the associated observation period $t_3$, defined by the time duration of each rise pulse in the output C of the rise filter 1. In region $E_2$ the first derivative value twice falls below the comparison value V while in region $E_3$ the first derivative value falls below the comparison value V only after termination of a rise pulse in output signal C.

In the control circuit 34 the number of pulses appearing at the output of comparison stage 33 during each rise pulse in output signal C is checked.

The control circuit 34, according to a further feature of the invention, includes a digital counter 35 to which a test circuit 36 is connected to check the counter state of the digital counter 35. The control circuit 34 emits a control signal B' having the form shown in FIG. 3g whenever the contents of digital counter 35 attain a value of "1" during the period $t_3$ of a rise pulse since in that case the first time derivative of the envelope will have fallen below the comparison value V only a single time, indicating that the received pulse was received without interference. The test circuit 36 is connected to a gating circuit 37 which is temporarily enabled by an output signal from a timer circuit 38 for the control signal B' before the time duration $t_3$ has expired.

The timer circuit 38, which is actuated by each rise pulse in the output signal C of the rise filter 1, is composed, for example, of two series-connected monostable multivibrators, the first multivibrator producing a pulse which is equal in duration to the time duration $t_3$ of a rise pulse in signal C minus the duration of one pulse interval defined by the pulse period of the second monostable multimultivibrator. The output pulse from the second multivibrator is triggered by the trailing edge of the output pulse from the first multivibrator and provides a gate enabling pulse for gating circuit 37 at the output of the timer circuit 38. Thus this enabling pulse has a duration determined by the period of the second monostable multivibrator and ends simultaneously with the associated rise pulse in signal C.

It is also possible to connect a second differentiating stage (32') between the first differentiating stage 32 and the comparison stage 33 and to check the second time derivative of the envelope of the received pulse. The control circuit 34 then determines whether the second time derivative falls below the comparison value V set in comparison stage 33 a single time during the duration of a rise pulse in output signal C.

The counter 35 is reset by each rise impulse in output signal C, differentiated in a differentiating stage 32', as shown in FIG. 5.

FIG. 3i shows the "good" signal G at the output of the signal generator 4 in a system employing the rise filter 1 and the modified threshold value detector 30 of FIG. 5.

If the control circuit 34 emits a control signal B', at the output of the signal generator 4 a "good" signal G' appears, as shown in FIG. 3i.

A measuring arrangement 13 is connected to the signal generator 4, as shown in FIG. 1, to evaluate the repetition frequency of pulses of "good" signal G at the output of the signal generator 4, from which a conclusion can be made as to the repetition frequency of the received pulses.

In another modification according to the invention, the pulse edge detector 5 and the threshold value detector of FIG. 4 are used, in addition to the rise filter 1, to generate the "good" signal G so as to realize a time definition of the shift of the pulses of "good" signal G with respect to the time of receipt $t_0$ of the received pulse.

Figure 6:
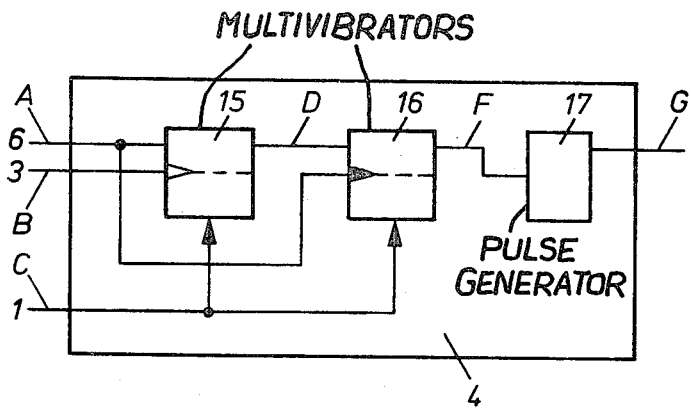
FIG. 6 is a block circuit diagram of an embodiment of a signal generator employed in the apparatus of FIG. 1.

According to this modification of the invention, the signal generator 4 can be composed of two bistable stages 15 and 16 and a pulse generator 17 as shown in FIG. 6. Each stage 15 and 16 includes a signal, or set, input, a trigger input and a clear input. If during an observation period $t_3$ the reference value R is detected and then a pulse appears in output signal B from threshold value detector 3, the signal generator 4 emits a "good" signal G as shown in FIG. 3i.

The signal input of the bistable stage 15 and the trigger input of stage 16 are connected to the output of the monostable multivibrator 6. The output signal B of the threshold value detector 3 acts on the trigger input of the bistable stage 15 and switches it to an output level D = logic "1" if the monostable multivibrator 6 remains in its astable switching state. FIG. 3k shows the time sequence of the output level D of the bistable stage 15. The connected, second bistable stage 16 is switched by the output of monostable multivibrator 6 and has its output connected to pulse generator 17. The output of stage 16 switches to F = logic "1" whenever the output level D of the bistable flip stage 15 equals logic "1" and the monostable multivibrator 6 has switched back to its stable switching state, as shown in FIG. 3 l. At the same time the pulse generator 17 is triggered to furnish the "good" signal G shown in FIG. 3i. Thus it is assured that a "good" signal pulse appears after the reference time $t_1$ plus the period $t_2$ which is defined by the selection of the reference value R and the band width of the receiving transducer W. The "clear" inputs of the two bistable stages 15 and 16 are connected with the output of the rise filter 1 which sets the bistable flip stages 15 and 16 back to the starting level D = F = logic "0" at the end of each transient period $t_3$.

The bistabile stages 15 and 16 are from the so called D-type, the bistabile stage 16 has an inverse signal input as shown in FIG. 6.

Successive "good" pulses G have the same time interval as successive received acoustic pulses.

In the measuring arrangement 13 the sequence of "good" signal pulses is evaluated and indicated, for example, as the flow speed. Such a measuring arrangement 13 is described, for example, in German Pat. No. 1,076,980, cited above.

Figure 7:
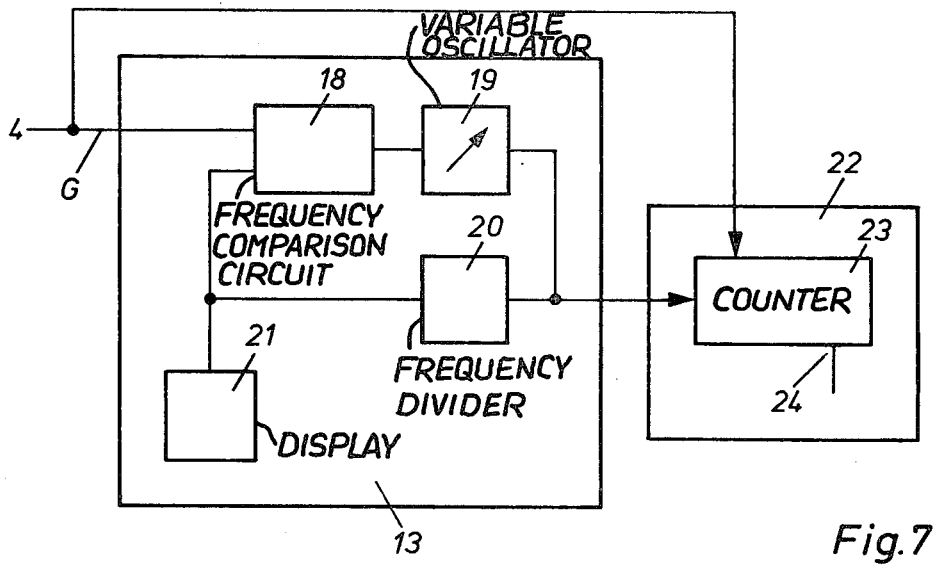
FIG. 7 is a block circuit diagram of an embodiment of a measuring arrangement employed in the apparatus of FIG. 1 together with a series connected error detector.

FIG. 7 shows, according to a further feature of the invention, a phase locked loop circuit forming an embodiment of the measuring arrangement 13 which cooperates particularly advantageously with the signal generator 4 of FIG. 6. The measuring arrangement 13 includes a frequency comparison circuit 18 in which the repetition rate of "good" signal pulses is compared with that of a pulse sequence furnished by a variable oscillator 19 via a connected frequency divider 20. The oscillator 19 is tuned in its frequency by the output of frequency comparison circuit 18 if the repetition rate at the output of the signal generator 4 deviates from that at the output of the frequency divider 20. The frequency divider 20 is connected to a display 21 which presents an indication of the time between two pulses of the "good" signal G or of the associated repetition frequency. With suitable calibration, the stream flow speed can be displayed for the example depicted in FIG. 2 if identical devices for the received pulses are provided downstream and upstream of associated transmitters and a difference is formed between the repetition frequencies of the received pulses.

An advantage of the measuring arrangement 13 shown in FIG. 7 is that the measurement is not interrupted when a "good" signal pulse is missing due to an interfered with received pulse. Instead the last obtained measuring result continues to be displayed and remains available so that the next following measuring result can effect a correction.

According to a further modification of the invention, the signal generator 4 can be connected to an error detector 22 which includes a counter 23 with a carry output 24, as shown in FIG. 7. The output of the oscillator 19 in the measuring arrangement 13 provides the clock pulses for the counter 23. The "clear" input of counter 23 is connected to the signal generator 4. The capacity of the counter 23 is selected so that the counter counts completely through its full range at the frequency of the oscillator 19 between two successive "good" signal pulses. If a "good" signal pulse is missing, a carry will appear at the carry output 24 of the counter 23, which is suitable to indicate an error. Upon the appearance of a "good" signal pulse the counter is set back to zero and a new test is made. If the "good" signal G shows a known jittering effect, which is permissible, a tolerance window can be set for the period of the "good" signal pulse, by proper dimensioning of counter 23.

Figure 8:
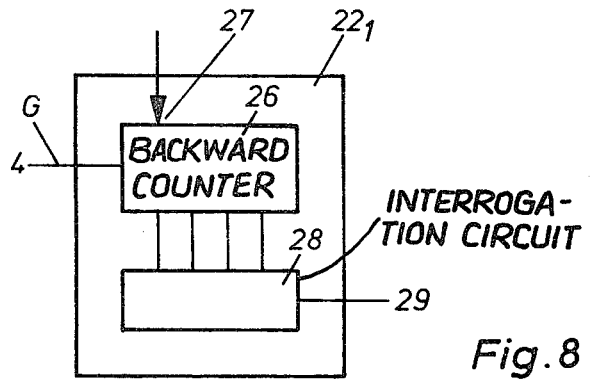
FIG. 8 is a block circuit diagram of a modified embodiment of an error detector.

FIG. 8 shows another embodiment of the error detector $22_1$ which can be used to particular advantage if a plurality of transmitted pulses are to be emitted in succession at the beginning of each measuring period. At the beginning of the measuring period, the number of such plurality of transmitted pulses is set in a backward counter 26 via a setting input 27 and each "good" signal at the output of the signal generator 4 sets it back by one position. At the end of the measuring period, if no interference occurred, the backward counter 26 is at zero. If one or more received pulses could not be evaluated due to multipath propagation, a residual count remains in backward counter 26 for the error indication. The outputs of the backward counter 26 are connected to an interrogation circuit 28, which can include a decoding logic, for the determination of the counter state and the emission of a switching signal.

When all transmitted pulses of one measuring period do not furnish evaluatable received pulses or when for a longer period of time no "good" signal G appears at the output of the signal generator 4, this indicates that the transmission conditions on the path being measured have changed considerably, e.g. the water level h, FIG. 2, has changed.

In order to be able to continue to make flow measurements without additional equipment, there is provided, according to a further advantageous feature of the invention, a second receiving transducer $W_2$ arranged, as shown in FIG. 2, vertically below the first receiving transducer $W_1$ at the receiving end E'. The distance a between the receiving transducers $W_1$ and $W_2$ can be selected in dependence on the length of the measuring path, the anticipated changes in the water level height h, the frequency of the sound energy oscillations and the beam angle $\alpha$, as is known for diversity reception by multipath propagation of radio waves in the atmosphere, the principles of which are disclosed in the above-cited text, Meinke, Gundlach, *Pocketbook of the High Frequency Art*, 1968, pulbished by Springer Verlag, third revised edition, in chapter J, "Wave Propagation", section 9, "Interference and Fading"; and chapter X, "Receivers", section 17, "Multiple Propagation".

The switching criterion in diversity reception, for the receiver array shown in FIG. 1, is furnished by the error detector 22 which actuates a stepping switch 29. Successive switching contacts of switch 29 are connected to respective ones of a plurality of receiving transducers $W_1, W_2, \ldots W_n$. Upon the emission of a switching signal at the output of the error detector 22, the switch 29 is advanced to the next receiving transducer. The switch output is the input of the apparatus according to the invention.

It will be understood that the above description of the present invention is susceptible to various modifications, changes and adaptations, and the same are intended to be comprehended within the meaning and range of equivalents of the appended claims.

What is claimed is:

1. For use with a system in which successive pulses, each composed of a train of high frequency oscillations, are emitted by a transmitting transducer, propagated through a transmission medium, and received by a receiving transducer having a given transient behavior, a starting transient period followed by a steady-state response, and a given response band width, apparatus for measuring the time interval between reception of successive pulses by the receiving transducer and for preventing erroneous measurements resulting from propagation of the pulses over indirect paths through the transmission medium, said apparatus comprising:

threshold value detecting means connected to said receiving transducer for receiving the output signal therefrom representative of each pulse received by said receiving transducer, said detecting means having an associated threshold value which is a function of the peak value of the output signal produced by said receiving transducer during steady-state response to a pulse, and said detecting means producing a signal when the output signal from said receiving transducer exceeds said threshold value;

rise filter means including a comparator connected to receive the output signal from said receiving transducer and to produce a trigger signal when the output signal from said receiving transducer exceeds a comparision value which is substantially less than the peak value of the output signal produced by said receiving transducer during steady-state response to a pulse, said rise filter means further including a timer member connected to receive trigger signals from said comparator for producing, in response to each such trigger signal, a rise pulse having a period at least equal to the reciprocal of the band width of said receiving transducer and not greater than the starting transient period of said receiving transducer;

signal generator means connected to said threshold value detecting means and to said rise filter means for producing a signal indicating good reception of a pulse each time said detecting means produces a signal in time coincidence with a rise pulse; and measuring means connected to receive the signals indicating good reception from said signal generator means and responsive thereto for providing an indication of the time interval between reception of successive pulses by said receiving transducer.

2. An arrangement as defined in claim 1 wherein said threshold value detecting means comprise: a threshold value generator for providing a threshold value equal to $\sqrt{1/2}$ times the peak value of the oscillations forming said receiving transducer output signal during steady-state response; and a comparison circuit connected to said threshold value generator and to the output of said receiving transducer for producing said detecting means signal.

3. An arrangement as defined in claim 1 wherein said threshold value detecting means comprise: an envelope detector connected to receive the output signal from said receiving transducer for producing a signal representative of the envelope of the oscillations constituting the output signal from said receiving transducer representative of each received pulse; a first differentiating stage connected to receive the signal produced by said envelope detector for forming a representation of the first time derivative of the envelope of each received pulse; a comparison stage connected to the output of said differentiating stage for producing an indication of each time that the first time derivative representation decreases through a second comparison value; and a control circuit connected for producing said detecting means signal only when said comparison stage produces only a single indication during the period of a respective rise pulse.

4. An arrangement as defined in claim 3 wherein said control circuit comprises: a digital counter connected to count each indication produced by said comparison stage during receipt of a respective pulse; a test circuit connected to produce a signal when said counter has a content of "1"; a gating circuit whose output provides said detecting means signal and connected to receive the signal produced by said test circuit; and a timer circuit connected to said gating circuit to supply a gate enabling pulse which permits passage of said test circuit signal to said gating circuit output during a period preceding termination of each rise pulse, whereby said gating means signal appears only when said counter has a content of "1" during a gate enabling pulse period.

5. An arrangement as defined in claim 1 further comprising: a pulse edge detector connected to the output of said receiving transducer for determining a given reference value from the ratio of the peak values of two consecutive oscillations occurring during the starting transient period of said receiving transducer in a known time interval occurring at a known reference time after the onset of reception of a pulse; and a first monostable multivibrator connected to be triggered by determination of such reference value by said pulse edge detector and having an astable state pulse period which is at least equal to the reciprocal of the band width of said receiving transducer, the output of said monostable multivibrator being connected to an input of said signal generator for permitting the onset of reception of a pulse to be determined by the known reference time plus the astable state pulse period of said monostable multivibrator; and wherein the time duration of each said rise pulse at the output of said rise filter means is equal to the starting transient period of said receiving transducer.

6. An arrangement as defined in claim 5 wherein said threshold value detecting means comprise a second monostable multivibrator connected to be triggered by the trailing edge of each pulse produced by said first monostable multivibrator; a threshold value generator connected to the output of said second multivibrator; and a comparison circuit connected to said threshold value generator and to the output of said receiving transducer for producing said detecting means output; said threshold value generator being responsive to said second multivibrator for providing a threshold value equal to $\sqrt{1/2}$ times the peak value of the oscillations forming said receiving transducer output during steady-state response prior triggering of said second multivibrator and a threshold value higher than such peak value after triggering of said second multivibrator and for a time less than that between reception of successive pulses.

7. An arrangement as defined in claim 6 wherein said signal generator means comprise first and second series-connected bistable stages; and a pulse generator connected to said second stage for producing at its output the signal indicating good reception; said first bistable stage having a signal input connected to the output of said first monostable multivibrator, and a clock pulse input connected to receive the signal produced by said threshold value detecting means, said second bistable stage having a signal input connected to the output of said first bistable stage, and a clock pulse input connected to the signal input of said first bistable stage, each said bistable stage having a clear input connected to the output of said timer member of said rise filter means.

8. An arrangement as defined in claim 1 wherein there are a plurality of receiving transducers arranged one under the other perpendicuarly to the direction of propagation of the transmitted pulses, and further comprising: a controllable switch having a plurality of contacts each connected to the output of a respective receiving transducer, and having an output selectively connected to a respective contact and connected to said threshold value detecting means and said rise filter means, said switch being operative to switch its output from one said contact to the next succeeding said contact upon receipt of a switching signal; and an error detector connected to receive the signal produced by said signal generator means for emitting a switching signal if during a given period of time diversity reception a signal indicating good reception has not been produced by said signal generator means.

9. An arrangement as defined in claim 1 wherein said threshold value detecting means comprise: an envelope detector connected to receive the output signal from said receiving transducer for producing a signal representative of the envelope of the oscillations constituting the output signal from said receiving transducer representative of each received pulse; a differentiating stage connected to receive the signal produced by said envelope detector for forming a representation of the second time derivative of the envelope of each received pulse; a comparison stage connected to the output of said differentiating stage for producing an indication of each time that the second time derivative representation decreases through a value of zero; and a control circuit connected for producing said detecting means signal only when said comparison stage produces only a single indication during the period of a respective rise pulse.

* * * * *